United States Patent
Truettner (10) Patent No.: US 8,472,223 B2
(45) Date of Patent: Jun. 25, 2013

(54) BOOTSTRAP GATE DRIVE FOR FULL BRIDGE NEUTRAL POINT CLAMPED INVERTER

(75) Inventor: Donald J. Truettner, Waukesha, WI (US)

(73) Assignee: ABB Inc., Cary, NC (US)

( * ) Notice: Subject to any disclaimer, the term of this patent is extended or adjusted under 35 U.S.C. 154(b) by 278 days.

(21) Appl. No.: 13/106,271

(22) Filed: May 12, 2011

(65) Prior Publication Data

US 2012/0257430 A1 Oct. 11, 2012

Related U.S. Application Data

(60) Provisional application No. 61/333,967, filed on May 12, 2010.

(51) Int. Cl.
*H02M 7/5387* (2007.01)

(52) U.S. Cl.
USPC ............ 363/132; 363/40; 363/41; 363/56.02; 363/131

(58) Field of Classification Search
USPC .................. 363/17, 40, 41, 55, 56.01, 56.02, 363/123, 125, 127, 131, 132
See application file for complete search history.

(56) References Cited

U.S. PATENT DOCUMENTS

| | | | |
|---|---|---|---|
| 4,970,635 A | 11/1990 | Shekhawat et al. | |
| 5,130,571 A | 7/1992 | Carroll | |
| 5,659,452 A | 8/1997 | Blackburn | |
| 5,886,888 A | 3/1999 | Akamatsu et al. | |
| 6,101,114 A | 8/2000 | Kijima et al. | |
| 6,147,887 A | 11/2000 | Miettinen | |
| 6,205,040 B1 | 3/2001 | Teichmann | |
| 6,256,215 B1 | 7/2001 | Barrett et al. | |
| 6,323,717 B1 | 11/2001 | Omura et al. | |
| 6,490,185 B1 | 12/2002 | Yamanaka et al. | |
| 6,972,972 B2 * | 12/2005 | Duncan et al. | 363/56.01 |
| 7,088,073 B2 | 8/2006 | Morishita | |
| 7,430,132 B2 | 9/2008 | Morishita | |
| 2006/0056211 A1* | 3/2006 | Tanaka et al. | 363/132 |
| 2009/0185405 A1* | 7/2009 | Masukawa | 363/131 |

OTHER PUBLICATIONS

Crittenden, David Brent, "Design Of A Neutral Point Clamped Power Inverter," Thesis submitted at Texas Tech. Univ., Chp. 3, pp. 10-13 (Dec. 1996).
Mailah,N.F., et al., "Neutral-Point-Clamped Multilevel Inverter Using Space Vector Modulation," Eur. J. Sci. Res., vol. 28, No. 1, pp. 83-85 (2009).

* cited by examiner

*Primary Examiner* — Nguyen Tran
(74) *Attorney, Agent, or Firm* — Robert Paul Nupp; Michael Charles Prewitt (57) ABSTRACT

In a neutral-point-clamped power inverter, gate drive circuit comprises four drive blocks providing bipolar DC signals to control switch gates. The first and third drive blocks are bootstrapped to the second and fourth. Inverter's neutral bus is commonly connected to the positive and negative DC buses through clamping capacitors. An arm of four serially-stacked-switches bridges DC buses. The switch arm midpoint is an output of the inverter. A first clamping diode connects the neutral bus to the first switch emitter; a second clamping diode connects the neutral bus to the third switch emitter. In one embodiment, a second switch arm mirrors the first, providing a second output; a second gate drive circuit mirrors the first. A bias circuit provides two reference voltages for the gate drive circuits. Three isolated DC sources provide signals that, when used by the gate drive circuit, result in seven isolated bipolar DC signals.

7 Claims, 5 Drawing Sheets

BOOTSTRAP GATE DRIVE FOR FULL BRIDGE NEUTRAL POINT CLAMPED INVERTER

CROSS REFERENCE TO RELATED APPLICATIONS

This application claims the benefit of U.S. provisional patent application No. 61/333,967 filed May 12, 2010, which is hereby incorporated by reference in its entirety.

BACKGROUND

Full bridge NPC inverters are commonly used in applications such as, for example, motor drives to develop AC waveforms from DC power supplies. The full bridge NPC inverter includes 8 switches which demand seven different gate drive potentials. There is a need in the art to efficiently and inexpensively provide the multiple gate drive potentials required for the NPC inverter.

SUMMARY

Described herein are full bridge neutral-point-clamped power inverters and bootstrapped gate drive circuits thereto.

In one embodiment described herein, a full bridge neutral-point-clamped power inverter is provided comprising a DC bus structure, a switching structure, three isolated bipolar DC power sources, and a gate drive network to selectively activate or deactivate the switches. The DC bus structure comprises a positive DC bus supplying a first DC supply voltage, a negative DC bus supplying a second DC supply voltage, and a neutral bus that substantially maintains a DC voltage that is approximately midway between the first and second DC supply voltages and that is connected to the positive DC bus by capacitors C1 and C3 and to the negative DC bus by capacitors C2 and C4. The switching structure comprises a first set of series-connected voltage-controlled switches S1-S4, where S1 is connected to the positive DC bus and to S2, S4 is connected to the negative DC bus and to S3, and S2 and S3 are connected to the neutral bus. The switching structure also comprises a second set of series-connected voltage-controlled switches S5-S8, where S5 is connected to the positive DC bus and to S6, S8 is connected to the negative DC bus and to S7, and S6 and S7 are connected to the neutral bus. The output of the inverter is the center point of each set of series connected switches. Clamping diodes D1-D4 are each connected to the neutral bus, where diode D1 is also connected to emitter E1 of switch S1, diode D2 is also connected to emitter E3 of switch S3, diode D3 is also connected to emitter E5 of switch S5, and diode D4 is also connected to emitter E7 of switch S7.

The first, second, and third isolated power sources each provide a bipolar DC signal that is referenced to the emitters of switches S2 and S6, and to negative DC bus, respectively. The gate drive network comprises a bias circuit that is connected across the DC bus from the positive to the negative bus signals that utilizes two zener diodes, filter capacitors, and current-limiting resistors to regulate voltage and provide two reference voltages to generate bootstrapped gate drive signals.

A first gate drive block for providing a gate signal to switch S1 has a first gate drive circuit and two capacitors connected to the emitter of switch S1, where the first capacitor is also connected to the gate drive circuit and indirectly to the first isolated DC power source through a first bootstrap diode, and where the second capacitor is also connected to the gate circuit and indirectly to the first reference voltage of the bias circuit. A second gate drive block for providing a gate signal to switch S2 has a second gate drive circuit and two capacitors connected to the emitter of switch S2, where the first and second capacitors are also connected to the gate drive circuit and to the first isolated bipolar DC power source. A third gate drive block for providing a gate signal to switch S3 has a first gate third gate drive circuit and two capacitors connected to the emitter of switch S3, where the first capacitor is also connected to the gate drive circuit and indirectly to the third isolated DC power source through a third bootstrap diode, and where the second capacitor is also connected to the gate circuit and indirectly to the second reference voltage of the bias circuit. A fourth gate drive block for providing a gate signal to switch S4 has a fourth gate drive circuit and two capacitors connected to the emitter of switch S4, where the first and second capacitors are also connected to the gate drive circuit and to the third isolated DC power source.

Finally, the gate drive network also has fifth, sixth, seventh, and eight drive blocks having the same topology as the first-fourth drive blocks, and each drive block selectively provides a bipolar DC input signal to a switch to activate or deactivate the gates of the switch in response to a control signal.

Also described herein is a neutral-point-clamped power inverter having a positive DC bus, a negative DC bus, and a neutral bus commonly connected to the positive and negative DC buses through first and second clamping capacitors, and having a set of four serially-stacked switches between the positive and negative DC buses, where the midpoint of the set of switches is an output of the inverter and where the neutral bus is additionally connected between a pair of clamping diodes, where the first clamping diode is connected to emitter of the first switch and the second clamping diode is connected to the emitter of the third switch. The inverter has a gate drive circuit comprising a first, second, third, and fourth drive blocks.

The first drive block has a first gate drive circuit and two capacitors connected to the emitter of the first switch. The first capacitor is also connected to the first drive circuit and indirectly to a positive signal of a first isolated DC source through a first bootstrap diode. The second capacitor is also connected to the first gate drive circuit and indirectly to a first reference signal through a second bootstrap diode. The second drive block has a second gate drive circuit and first and second capacitors connected to emitter of the second switch. The first capacitor is also connected to the second gate drive circuit and to the positive signal of the first isolated DC source, and the second capacitor is also connected to the second gate drive circuit and to a negative signal of the first isolated DC source.

The third gate drive block has a third gate drive circuit and two capacitors connected to the emitter of the third switch. The first capacitor is also connected to the third gate drive circuit and indirectly to a positive signal of a second isolated DC source through third a bootstrap diode, and the second capacitor is also connected to the third gate drive circuit and indirectly to a second reference signal through a fourth bootstrap diode. The fourth gate drive block has a fourth gate drive circuit and two capacitors connected to the emitter of the fourth switch. The first capacitor is also connected to the fourth gate drive circuit and to the positive signal of the second isolated DC source. The second capacitor is also connected to the fourth gate drive circuit and to a negative signal of the second isolated DC source.

Finally, the gate drive blocks provide bipolar DC gate input signals to the gates of the switches, thereby activating them or deactivating them in response to a control signal. The first and second reference signals are provided by a gate drive bias network.

DETAILED DESCRIPTION

Figure 1:
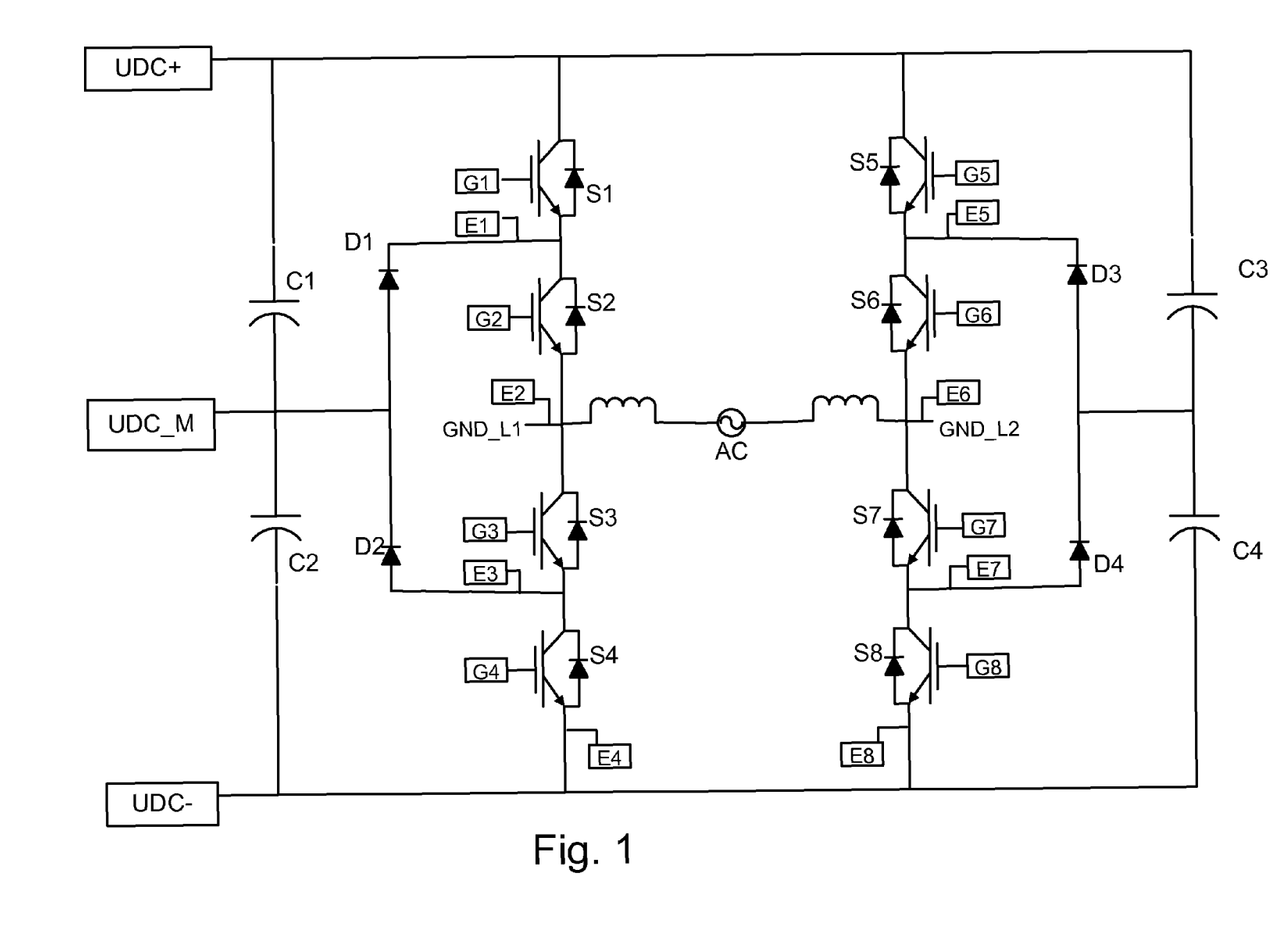
FIG. 1 is a circuit diagram of a neutral point clamped full bridge inverter.

With reference now to FIG. 1, a neutral-point-clamped full bridge inverter is shown. The inverter may be used, for example, in solar applications as a solar power inverter. The inverter output is the center-point of each series connection of four switches (S1, S2, S3, S4; and S5, S6, S7, S8), represented in FIG. 1 as voltage source AC. In one embodiment, the output of series S1, S2, S3, S4 is 180° out of phase from the output of series S5, S6, S7, S8. It should be appreciated that the switches S1-S8 are voltage controlled devices such as, for example, IGBTs or MOSFETs, and that each switch S1-S8 has an emitter terminal E1-E8. For the sake of clarity, the terms "emitter" and "source" are used interchangeably herein, and denote analogous components of IGBTs and MOSFETs.

With continued reference to FIG. 1, the DC bus UDC is connected to the top and bottom row switches S1, S5 and S4, S8 respectively. A mid-point/neutral point of the DC bus is connected to UDC+ and UDC− by a pair of capacitors C1/C3 and C2/C4 respectively. The mid-point is also connected between a pair of diodes D1 and D2. Diode D1 is connected to emitter E1 of switch S1 and diode D2 is connected to emitter E3 of switch S3. Likewise diode D3 is connected to emitter E5 of switch S5 and diode D4 is connected to emitter E7 of switch S7. These four diodes (D1-D4) are connected to the neutral bus and act to control the voltage distribution among the four switches in each series.

In general, a switch (e.g., IGBT or MOSFET) requires a gate input signal to turn on (i.e. close), and the gate input signal must be referenced between the switch gate and emitter terminal. Thus, when a suitable gate signal is applied to a switch, it closes (i.e. conducts). With continued reference to FIG. 1, each switch S1-S8 is actuated by a gate input signal G1-G8, respectively.

Referring to the left half-bridge of FIG. 1, if switches S1 and S2 are turned on, the output is connected to the positive bus UDC+. When switches S3 and S4 are turned on, the output is connected to the negative bus UDC−. When switches S2 and S3 are turned on, the output is connected to the neutral or mid-point bus UDC_M. By controlling the switches, waveforms are generated.

Figure 2:
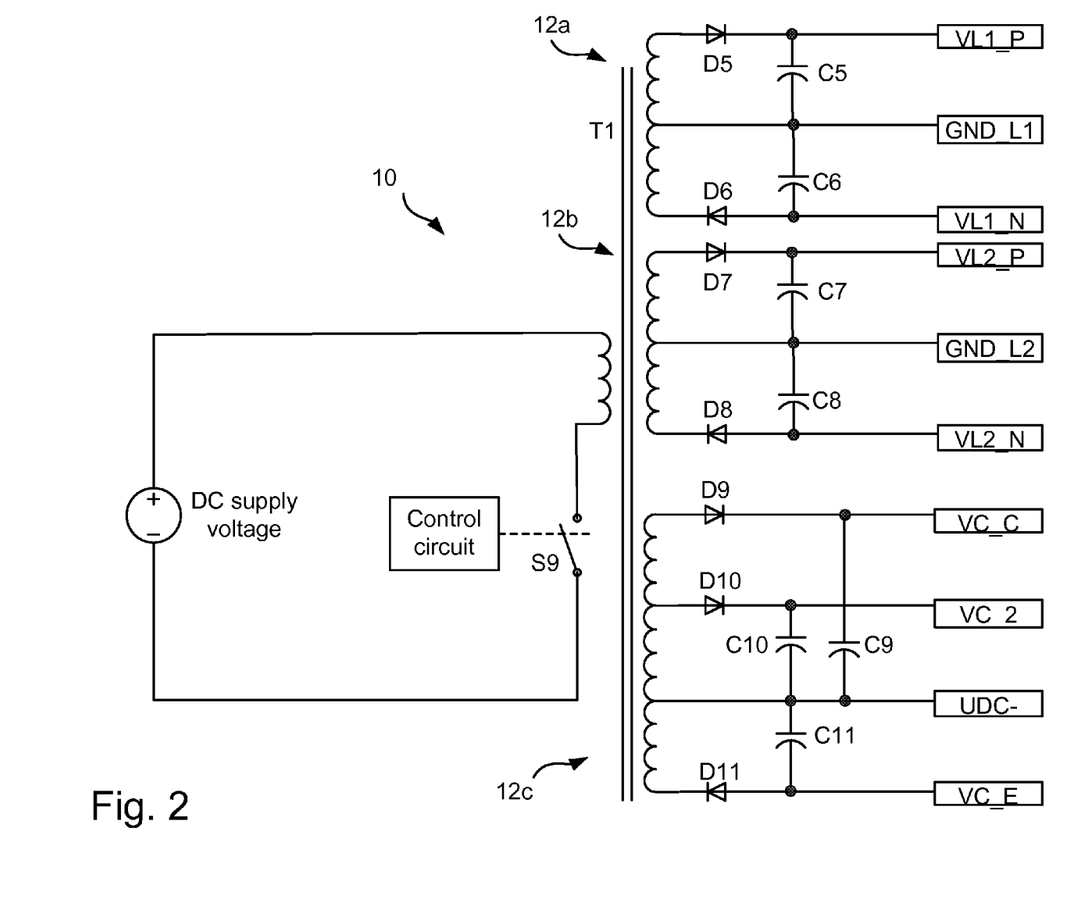
FIG. 2 is a circuit diagram of an isolated DC/DC power supply.

With reference now to FIG. 2, a DC/DC converter 10 is shown which, as will be described below in greater detail, provides isolated and regulated voltages used for the gate input signals of the NPC inverter. Input power is provided by a DC supply voltage. Switch S9 is modulated alternately on and off to produce a voltage waveform on the primary of transformer T1. A control circuit controls switch S9 and includes a pulse width modulator. Energy is transferred by magnetic coupling to individual secondaries, which include diodes D5-D11 to convert the AC waveforms to DC and capacitors C5-C11 to store energy on the DC secondary circuits.

As can be seen, a first power supply 12a outputs a first bi-polar isolated supply voltage (VL1_P and VL1_N) that is referenced to ground GND_L1. A second power supply 12b outputs a second bi-polar isolated supply voltage (VL2_P and VL2_N) that is referenced to ground GND_L2. A third power supply 12c outputs a third bi-polar supply voltage (VC_C and VC_E) that is referenced to negative DC bus UDC−. In one non-limiting embodiment, the VL1_P, VL2_P and VC_C are +15V and VL1_N, VL2_N and VC_E are −5V. Each of the voltage supplies are galvanically isolated from each other through the magnetic coupling for transformer T1. The third supply also outputs an additional voltage VC_2 that has the same reference as VC_C but a lower magnitude.

As previously mentioned, gate input signals G1-G8 must be referenced between the respective switch gate and emitter terminal. Referring to FIG. 1 (NPC bridge) and FIG. 2 (power supply), it may be appreciated that G4 and G8 are referenced to UDC−, G2 is referenced to GND_L1, and G6 is referenced to GND_L2. Conversely, G1, G3, G5, and G7 are referenced to E1, E3, E5, and E7, which "float": for example, when S1 is ON, the E1 signal is connected to UDC+; when S1 is OFF and S2 is ON, E1 is connected to GND_1 potential. This illustrates the need for isolation.

Figure 3:
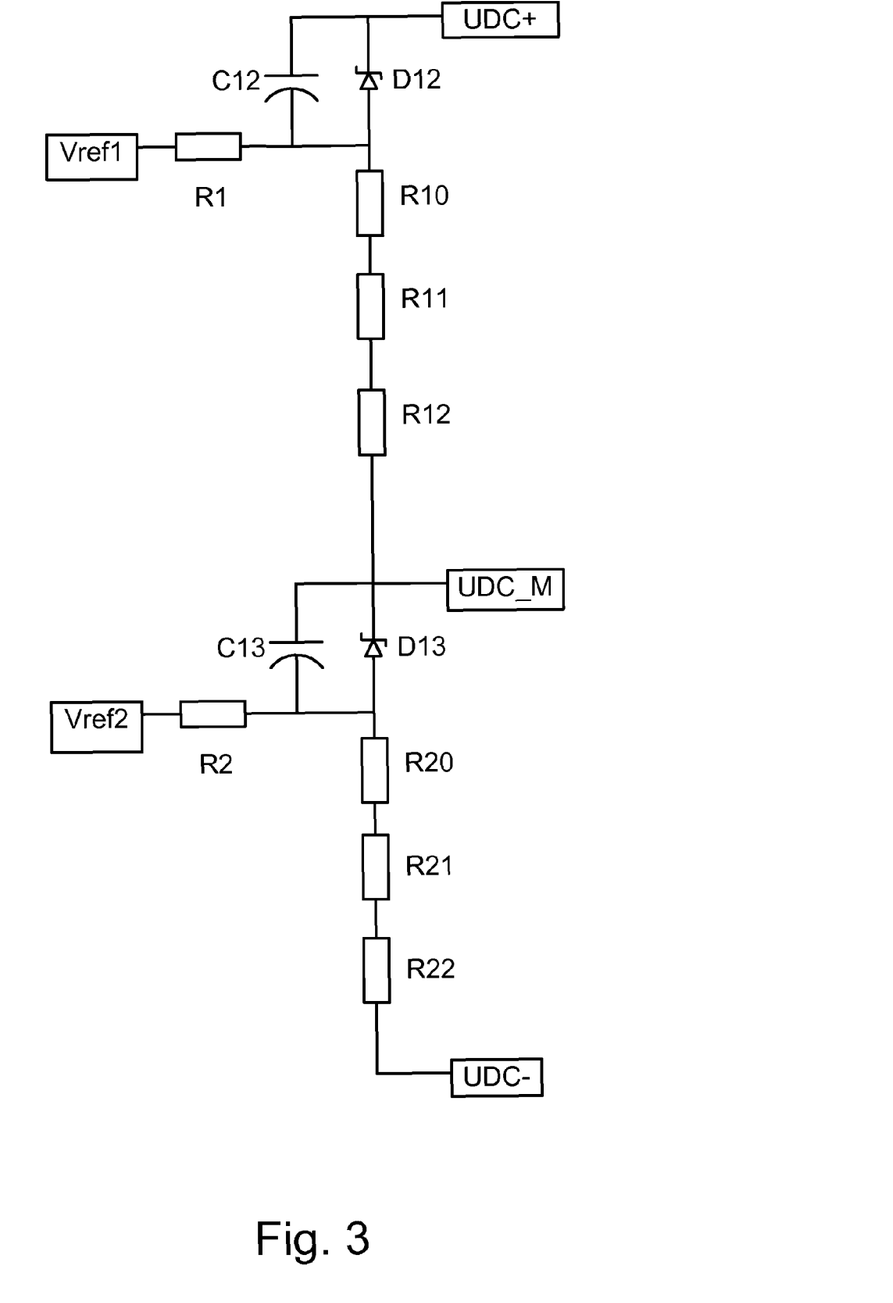
FIG. 3 is a circuit diagram of a gate drive bias network.

With reference now to FIG. 3, a gate drive bias network is shown. The bias network provides a balancing function for the capacitors C1-C4 (e.g., there is no need for resistors to relieve any leakage current), a means to discharge the capacitor bank C1-C4, and a means to generate a pair of reference voltages Vref1 and Vref2. As can be seen, a zener diode D12 and a plurality of resistors R10-R12 are connected in series between UDC+ and UDC_M. Likewise, a zener diode D13 and a plurality of resistors R20-R22 are connected in series between UDC_M and UDC−. The resistors R10-R12 and R20-R22 set up the proper bias current in the zener diodes D12 and D13 respectively, so that they properly regulate the voltage. Zener diodes D12 and D13 may be rated nominally, for example, from about 5-10 volts. Capacitor C12 is connected across diode D12 and capacitor C13 is connected across diode D13. Capacitors C12 and C13 function as electrolytic filter capacitors, and provide energy storage at the same voltage as the respective diode.

A reference voltage output Vref1 is connected to C12 and D12 through a current limiting resistor R1. Likewise, a reference voltage output Vref2 is connected to C13 and D13 through a current limiting resistor R2. As will be described below, the reference voltages Vref1 and Vref2 are used to generate gate drive signals.

The gate drive bias network provides the voltage reference Vref1 and Vref2 to the bootstrap gate drives U1 and U3 (described below). Assuming diode D12 regulates a voltage Vz, when measuring voltage from UDC−, the voltage at Vref1 will be (UDC+)−Vz. Likewise, the voltage at Vref2 will be (UDC_M)−Vz.

Figure 4:
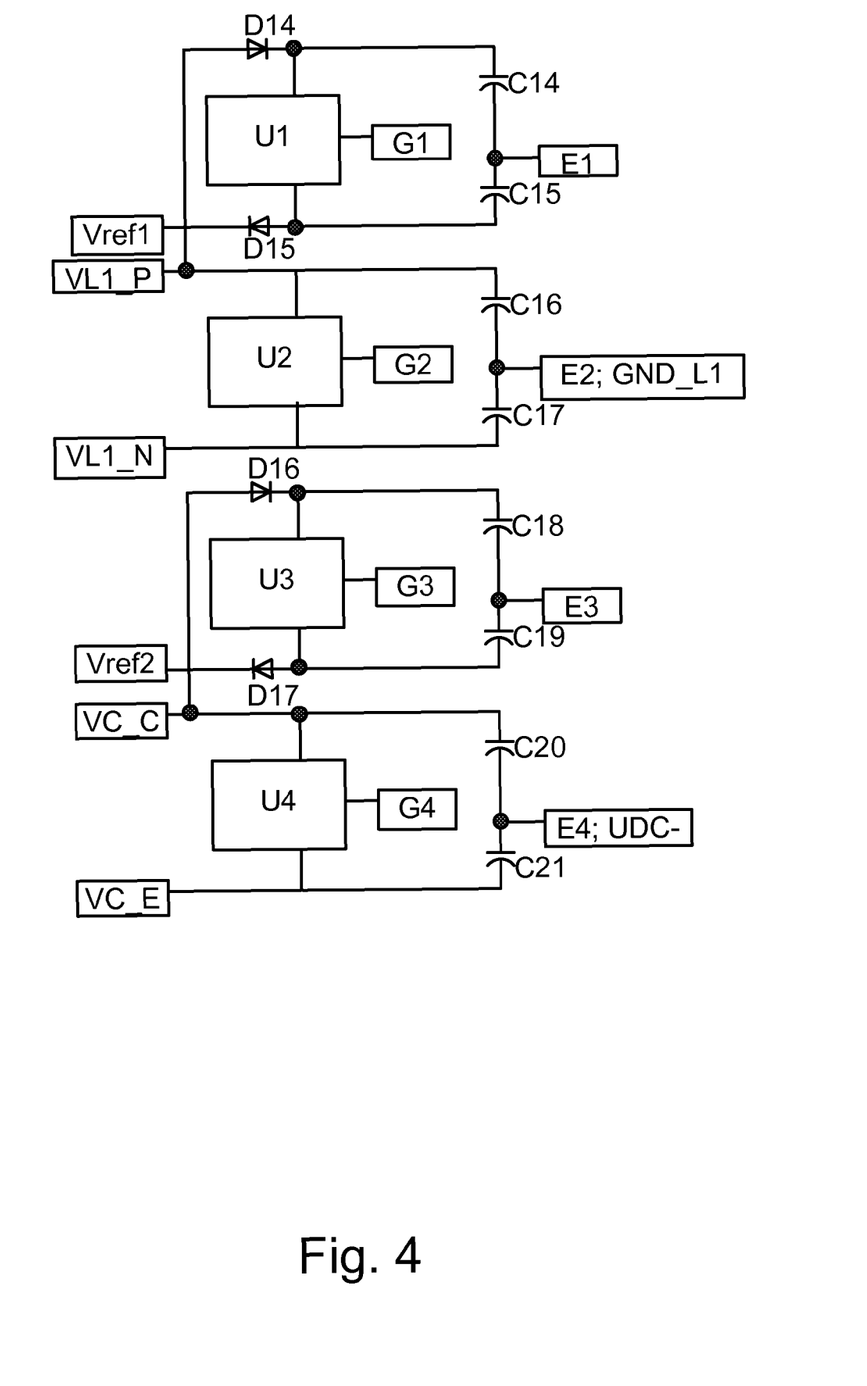
FIG. 4 is a circuit diagram of a gate drive configuration for supplying gate voltages G1-G4.

With reference now to FIG. 4, the gate drive diagram is shown. Each gate drive circuit U1-U4 receives control signals from a controller (not shown) and applies the appropriate gate input signal G1-G4 to the associated gate of each switch S1-S4. Thus, each gate drive circuit is responsible for turning on and off a single switch. According to the present invention, when a control signal is sent to each gate drive block, the gate drive produces a bipolar output signal that the connected switch uses to either turn on or off. Because each switch S1-S4 is at a different potential (due to the topology shown in FIG. 1), each gate drive U1-U4 must be isolated to avoid cross-conduction, which is accomplished by the secondary windings of the power supply and/or the boot-strap topology, as described below.

As can be seen, the circuit shown in FIG. 4 includes four boot-strap diodes D14-D17 which allow the charge transfer between upper (floating) and lower gate drives (U1, U3, U5, U7; and U2, U4, U6, U8, respectively) while preserving voltage isolation. Likewise, capacitors C14-C21 function as energy storage capacitors for the gate drives. As shown in FIG. 4, the emitter E1 of switch S1 is connected between capacitors C14 and C15. C14 is connected to U1 and also to VL1_P through diode D14. C15 is connected to U1 and also to Vref1 through diode D15. The emitter E2 (i.e. GND_L1 of FIG. 1) of switch S2 is connected between capacitors C16 and C17. C16 is connected to U2 and also directly connected to VL1_P. C17 is connected to U2 and VL1_N. The emitter E3 of switch S3 is connected between capacitors C18 and C19. C18 is connected to U3 and also to VC_C through diode D16. C19 is connected to U3 and also to Vref2 through diode D17. The emitter E4 (i.e. connected to UDC− of FIG. 1) of switch S4 is connected between capacitors C20 and C21. C20 is connected to U4 and also directly connected to VC_C. C21 is connected to U4 and VC_E.

From FIG. 4, it may be seen that capacitors C14 and C15 are referenced to E1 and capacitors C18 and C19 are referenced to E3—e.g., reflecting that gate drives U1 and U3 supply voltages for S1 and S3 that are floating. Diodes D14-D17 are called bootstrap diodes and allow capacitors C14 and C18 to be charged when S2 or S4 are ON. When S1 or S3 are ON, the diodes D14 and D16 are reversed biased and do not allow current to flow but D15 and D17 are forward biased and allow C15 and C19 to be charged.

As shown above, the power supply of FIG. 2 produces three isolated bipolar supply voltages VL1_P/VL1_N, VL2_P/VL2_N and VC_C/VC_E. These supplies are galvanically isolated from each other through magnetic coupling of the transformer T1. As can be seen in FIG. 4, the first supply VL1_P/VL1_N powers the gate drive U2 directly and U1 through the bootstrap diode D14. Likewise, third supply VC_C/VC_E powers the gate drive U4 directly and U3 through the bootstrap diode D16. Thus, it may be appreciated that supply voltages for S2, S4 are isolated by the secondary windings of the power supply, whereas supply voltages for S1, S3 are isolated by the bootstrap topology previously described.

Figure 5:
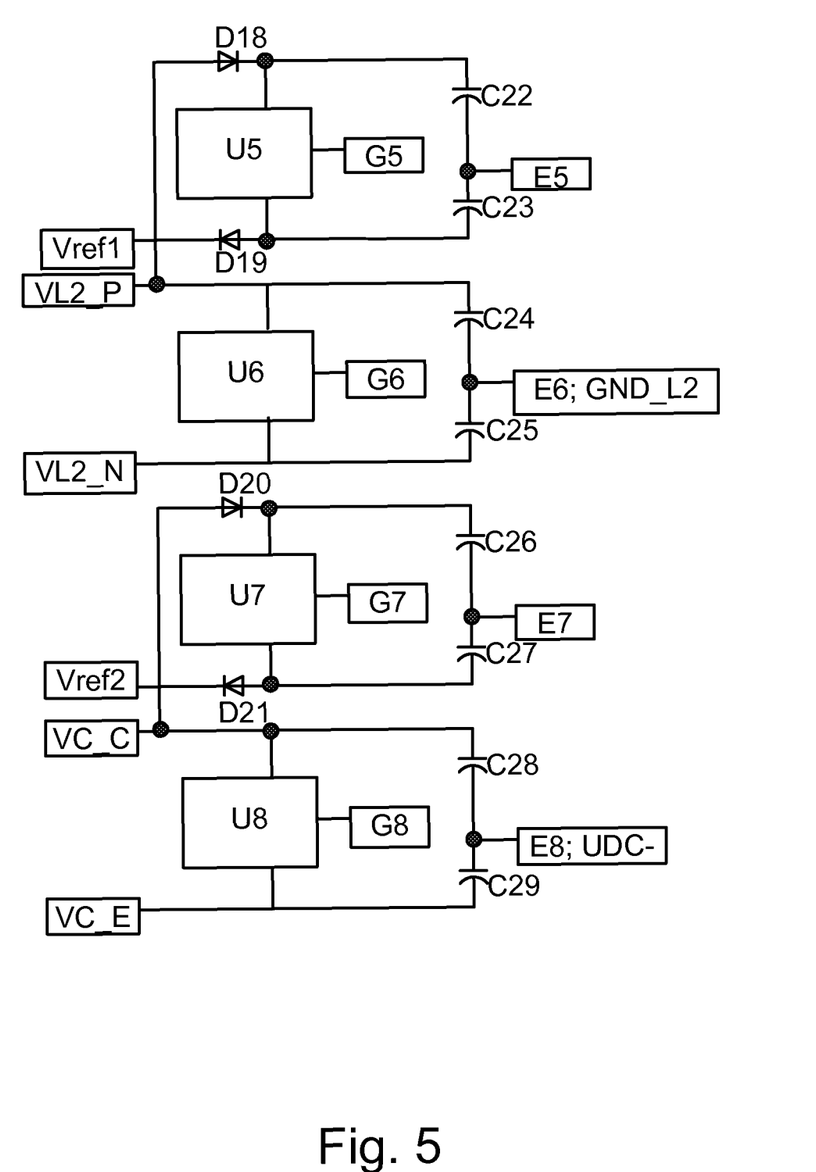
FIG. 5 is a circuit diagram of a gate drive configuration for supplying gate voltages G5-G8.

With reference to FIG. 5, the topology for gate drives U5-U8 (for controlling gates G5-G8) is shown. As can be seen, the topology is substantially similar to gate drives U1-U4.

An illustrative example of the charging of a gate drive is discussed below. If U4 outputs a signal G4 to close S4, the connection E3 will go to the E4 potential (i.e. UDC−). In so doing, C18 will be charged by current flowing out of power supply VC_C, through diode D16 and into C18. Because U3 is commanded OFF by the controller (not shown), no charge is taken from C18 and the voltage remains across C18. If S4 is commanded OFF by the controller and instead S2 and S3 are commanded ON, the connection E3 will be at UDC_M potential. Thus, capacitor C19 will be charged by current flowing from capacitor C13, through D1, through S2 and S3, through C19, through D17 and back to Vref2 potential. U1 is charged in the same manner except that it uses Vref1 circuitry.

One of ordinary skill in the art will appreciate that prior to the inverter doing any useful work (i.e. modulating), all of the bootstrap capacitors should be charged.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:
1. A full-bridge neutral-point-clamped power inverter, comprising:
   a DC bus structure comprising
      a positive DC bus supplying a first DC supply voltage,
      a negative DC bus supplying a second DC supply voltage, and
      a neutral bus that substantially maintains a DC voltage that is approximately midway between the first and second DC supply voltages and that is connected to the positive DC bus by capacitors C1 and C3 and to the negative DC bus by capacitors C2 and C4;
   a switching structure comprising
      a first set of series-connected voltage-controlled switches S1-S4, where S1 is connected to the positive DC bus and to S2, S4 is connected to the negative DC bus and to S3, and S2 and S3 are connected to the neutral bus,
      a second set of series-connected voltage-controlled switches S5-S8, where S5 is connected to the positive DC bus and to S6, S8 is connected to the negative DC bus and to S7, and S6 and S7 are connected to the neutral bus, and
      clamping diodes D1-D4 that are each connected to the neutral bus, where diode D1 is also connected to emitter E1 of switch 51, diode D2 is also connected to emitter E3 of switch S3, diode D3 is also connected to emitter E5 of switch S5, and diode D4 is also connected to emitter E7 of switch S7;
   a first DC power source that provides a first isolated bipolar DC signal VL1_P and VL1_N that is referenced to emitter E2 of switch S2;
   a second DC power source that provides a second isolated bipolar DC signal VL2_P and VL2_N that is referenced to emitter E6 of switch S6;
   a third DC power source that provides a third isolated bipolar DC signal VC_C and VC_E that is referenced to the negative DC bus; and
   a gate drive network comprising
      a gate drive bias circuit providing a pair of reference voltages Vref1 and Vref2 comprising
         a first zener diode D12 connected in series between the positive DC bus and neutral bus,
         a second zener diode D13 connected in series between the negative DC bus and neutral bus,
         first and second capacitors C12 and C13 connected across zener diodes D12 and D13, respectively,
         where Vref1 is connected to C12 and D12 through a first current limiting resistor R1 and Vref2 is connected to C13 and D13 through a second current limiting resistor R2
      a first gate drive block comprising a first gate drive circuit U1 and capacitors C14 and C15 connected to emitter E1, where C14 is also connected to U1 and indirectly to VL1_P through first bootstrap diode D14, and where C15 is also connected to U1 and indirectly to Vref1 through second bootstrap diode D15, a second gate drive block comprising a second gate drive circuit U2 and capacitors C16 and C17 connected to emitter E2, where C16 is also connected to U2 and to VL1_P, and where C17 is also connected to U2 and to VL1_N, a third gate drive block comprising a third gate drive circuit U3 and capacitors C18 and C19 connected to emitter E3, where C18 is also connected to U3 and indirectly to VC_C through third bootstrap diode D16, and where C19 is also connected to U3 and indirectly to Vref2 through fourth bootstrap diode D17, a fourth gate drive block comprising a fourth gate drive circuit U4 and capacitors C20 and C21 connected to emitter E4, where C20 is also connected to U4 and to VC_C, and where C21 is also connected to U4 and to VC_E a fifth gate drive block comprising a fifth gate drive circuit U5 and capacitors C22 and C23 connected to emitter E5, where C22 is also connected to U5 and indirectly to VL2_P through fifth bootstrap diode D18, and where C23 is also connected to U5 and indirectly to Vref1 through sixth bootstrap diode D19, a sixth gate drive block comprising a sixth gate drive circuit U6 and capacitors C24 and C25 connected to emitter E6, where C24 is also connected to U6 and to VL2_P, and where C25 is also connected to U6 and to VL2_N, a seventh gate drive block comprising a seventh gate drive circuit U7 and capacitors C26 and C27 connected to emitter E7, where C26 is also connected to U7 and indirectly to VC_C through seventh bootstrap diode D20, and where C27 is also connected to U7 and indirectly to Vref2 through eight bootstrap diode D21, and an eighth gate drive block comprising an eighth gate drive circuit U8 and capacitors C28 and C29 connected to emitter E8, where C28 is also connected to U8 and to VC_C, and where C29 is also connected to U8 and to VC_E where the output of the inverter is the center point of each set of series connected switches S1-S4 and S5-S8, where U1 selectively provides signal G1 to switch S1, U2 selectively provides signal G2 to switch S2, U3 selectively provides signal G3 to switch S3, U4 selectively provides signal G4 to switch S4, U5 selectively provides signal G5 to switch S5, U6 selectively provides signal G6 to switch S6, U7 selectively provides signal G7 to switch S7, U8 selectively provides signal G8 to switch S8, and where signals G1-G8 are bipolar DC input signals that operate to activate or deactivate the gates of switches S1-S8 in response to a control signal.

2. The power inverter of claim 1 where the first, second, and third isolated bipolar DC signals VL1, VL2 and VC are provided by independent secondary windings of a transformer having a primary winding that is connected to a single DC power supply.

3. The power inverter of claim 1 where VL1_P, VL2_P, and VC_C are each about +15V and VL1_N, VL2_N, and VC_E are each about −5V.

4. In a neutral-point-clamped power inverter having a positive DC bus with voltage UDC+ and a negative DC bus with voltage UDC− and a neutral bus at voltage UDC_M commonly connected to the positive and negative DC buses through capacitors C1 and C2, and having a first set (S1-S4) of serially-stacked switches between the positive and negative DC buses, where the midpoint of the first set of switches is an output of the inverter and where the neutral bus is additionally connected between a pair of diodes D1 and D2, where D1 is connected to emitter E1 of switch S1 and diode D2 is connected to emitter E3 of switch S3, the gate drive circuit comprising:

a first gate drive block comprising a first gate drive circuit U1 and capacitors C14 and C15 connected to emitter E1 of switch S1, where C14 is also connected to U1 and indirectly to a positive signal VL1_P of a first isolated DC source through first bootstrap diode D14, and where C15 is also connected to U1 and indirectly to a first reference signal Vref1 through second bootstrap diode D15;

a second gate drive block comprising a second gate drive circuit U2 and capacitors C16 and C17 connected to emitter E2 of switch S2, where C16 is also connected to U2 and to VL1_P, and where C17 is also connected to U2 and to a negative signal VL1_N of the first isolated DC source;

a third gate drive block comprising a third gate drive circuit U3 and capacitors C18 and C19 connected to emitter E3 of switch S3, where C18 is also connected to U3 and indirectly to a positive signal VC_C of a second isolated DC source through third bootstrap diode D16, and where C19 is also connected to U3 and indirectly to a second reference signal Vref2 through fourth bootstrap diode D17; and a fourth gate drive block comprising a fourth gate drive circuit U4 and capacitors C20 and C21 connected to emitter E4 of switch S4, where C20 is also connected to U4 and to VC_C, and where C21 is also connected to U4 and to a negative signal VC_E of the second isolated DC source, where U1 selectively provides signal G1 to switch S1, U2 selectively provides signal G2 to switch S2, U3 selectively provides signal G3 to switch S3, U4 selectively provides signal G4 to switch S4, where signals G1-G4 are bipolar DC input signals that operate to activate or deactivate the gates of switches S1-S4 in response to a control signal, where Vref1 and Vref2 are provide by a gate drive bias network connected across the DC bus voltage of the inverter, from UDC+ to UDC− and having a first zener diode D12 and a plurality of resistors R10-R12 that are connected in series between UDC+ and UDC_M, where R10-R12 set a bias current for diode D12, a second zener diode D13 and a plurality of resistors R20-R22 that are connected in series between UDC_M and UDC−, where R20-R22 set a bias current for diode D13, a first capacitor C12 that is connected across diode D12 and a second capacitor C13 that is connected across diode D13, where capacitors C12 and C13 function as electrolytic filter capacitors, where Vref1 is connected to C12 and D12 through a first current limiting resistor R1, and Vref2 is connected to C13 and D13 through a second current limiting resistor R2.

5. The gate drive circuit of claim 4 where the first and second isolated bipolar DC signals VL1 and VC are provided by independent secondary windings of a transformer having a primary winding that is connected to a single DC power supply.

6. The gate drive circuit of claim 4 where VL1_P and VC_C are each about +15V and VL1_N and VC_E are each about −5V.

7. In a neutral-point-clamped power inverter having a positive DC bus with voltage UDC+ and a negative DC bus with voltage UDC− and a neutral bus at voltage UDC_M commonly connected to the positive DC bus through capacitors C1 and C3 and to the negative DC bus through the capacitors C2 and C4, and having a first set (S1-S4) and a second set (S5-S8) of serially-stacked switches between the positive and negative DC buses, where the midpoints of the first and second set of switches are outputs of the inverter and where the neutral bus is additionally connected between two pairs of diodes D1/D2 and D3/D4, where D1 is connected to emitter E1 of switch S1, diode D2 is connected to emitter E3 of switch S3, diode D3 is connected to emitter E5 of switch S5, diode D7 of switch S7, the gate drive circuit comprising:

a first gate drive block comprising a first gate drive circuit U1 and capacitors C14 and C15 connected to emitter E1 of switch S1, where C14 is also connected to U1 and indirectly to a positive signal VL1_P of a first isolated DC source through first bootstrap diode D14, and where C15 is also connected to U1 and indirectly to a first reference signal Vref1 through second bootstrap diode D15;

a second gate drive block comprising a second gate drive circuit U2 and capacitors C16 and C17 connected to emitter E2 of switch S2, where C16 is also connected to U2 and to VL1_P, and where C17 is also connected to U2 and to a negative signal VL1_N of the first isolated DC source;

a third gate drive block comprising a third gate drive circuit U3 and capacitors C18 and C19 connected to emitter E3 of switch S3, where C18 is also connected to U3 and indirectly to a positive signal VC_C of a second isolated DC source through third bootstrap diode D16, and where C19 is also connected to U3 and indirectly to a second reference signal Vref2 through fourth bootstrap diode D17; and a fourth gate drive block comprising a fourth gate drive circuit U4 and capacitors C20 and C21 connected to emitter E4 of switch S4, where C20 is also connected to U4 and to VC_C, and where C21 is also connected to U4 and to a negative signal VC_E of the second isolated DC source, a fifth gate drive block comprising a fifth gate drive circuit U5 and capacitors C22 and C23 connected to emitter E5 of switch S5, where C22 is also connected to U5 and indirectly to a positive signal VL2_P of a third isolated DC source through fifth bootstrap diode D18, and where C23 is also connected to U5 and indirectly to Vref1 through sixth bootstrap diode D19;

a sixth gate drive block comprising a sixth gate drive circuit U6 and capacitors C24 and C25 connected to emitter E6 of switch S6, where C24 is also connected to U6 and to VL2_P, and where C25 is also connected to U6 and to a negative signal VL2_N of the third isolated DC source;

a seventh gate drive block comprising a seventh gate drive circuit U7 and capacitors C26 and C27 connected to emitter E7 of switch S7, where C26 is also connected to U7 and indirectly to VC_C through seventh bootstrap diode D20, and where C27 is also connected to U7 and indirectly to Vref2 through eight bootstrap diode D21; and an eighth gate drive block comprising an eighth gate drive circuit U8 and capacitors C28 and C29 connected to emitter E8 of switch S8, where C28 is also connected to U8 and to VC_C, and where C29 is also connected to U8 and to VC_E, where U1-U8 selectively provide signals G1-G8 to switches S1-28, respectively, where signals G1-G8 are bipolar DC input signals that operate to activate or deactivate the gates of switches S1-S8 in response to a control signal, where Vref1 and Vref2 are provide by a gate drive bias network connected across the DC bus voltage of the inverter, from UDC+ to UDC− and having a first zener diode D12 and a plurality of resistors R10-R12 that are connected in series between UDC+ and UDC_M, where R10-R12 set a bias current for diode D12, a second zener diode D13 and a plurality of resistors R20-R22 that are connected in series between UDC_M and UDC−, where R20-R22 set a bias current for diode D13, a first capacitor C12 that is connected across diode D12 and a second capacitor C13 that is connected across diode D13, where capacitors C12 and C13 function as electrolytic filter capacitors, where Vref1 is connected to C12 and D12 through a first current limiting resistor R1, and Vref2 is connected to C13 and D13 through a second current limiting resistor R2.

* * * * *